United States Patent
Varaprasad et al.

(10) Patent No.: US 10,276,440 B2
(45) Date of Patent: Apr. 30, 2019

(54) REMOVABLE TEMPORARY PROTECTIVE LAYERS FOR USE IN SEMICONDUCTOR MANUFACTURING

(71) Applicant: Honeywell International Inc., Morris Plains, NJ (US)

(72) Inventors: Desaraju Varaprasad, Dublin, CA (US); Ronald R. Katsanes, Newark, CA (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/849,988

(22) Filed: Dec. 21, 2017

(65) Prior Publication Data

US 2018/0204770 A1    Jul. 19, 2018

Related U.S. Application Data

(60) Provisional application No. 62/448,177, filed on Jan. 19, 2017.

(51) Int. Cl.

| | |
|---|---|
| *H01L 21/301* | (2006.01) |
| *H01L 21/46* | (2006.01) |
| *H01L 21/78* | (2006.01) |
| *C09D 129/04* | (2006.01) |
| *C09D 5/00* | (2006.01) |
| *H01L 21/02* | (2006.01) |
| *H01L 21/683* | (2006.01) |
| *H01L 21/3105* | (2006.01) |

(52) U.S. Cl.
CPC ............ *H01L 21/78* (2013.01); *C09D 5/00* (2013.01); *C09D 5/008* (2013.01); *C09D 129/04* (2013.01); *H01L 21/02118* (2013.01); *H01L 21/02282* (2013.01); *H01L 21/31058* (2013.01); *H01L 21/6836* (2013.01); *H01L 2221/68327* (2013.01)

(58) Field of Classification Search
CPC ..... H01L 21/78; H01L 21/02118; C09D 5/00; C09D 129/04
USPC ........................................................ 438/465
See application file for complete search history.

(56) References Cited

U.S. PATENT DOCUMENTS

| | | | |
|---|---|---|---|
| 6,233,972 B1 | 5/2001 | Foster et al. | |
| 6,582,983 B1 | 6/2003 | Runyon et al. | |
| 6,689,414 B2 | 2/2004 | Weber et al. | |
| 6,849,328 B1 | 2/2005 | Medwick et al. | |
| 8,728,716 B2 | 5/2014 | Andou et al. | |
| 9,130,030 B1 * | 9/2015 | Park ................... | H01L 21/78 |
| 2007/0117040 A1 | 5/2007 | Brock et al. | |

(Continued)

FOREIGN PATENT DOCUMENTS

JP         5454780 B2    6/2011

*Primary Examiner* — David S Blum
(74) *Attorney, Agent, or Firm* — Faegre Baker Daniels LLP

(57) ABSTRACT

A method for temporarily protecting a semiconductor device wafer during processing includes preparing a solution including poly(vinyl alcohol) and water, coating the device wafer with the prepared solution, baking the coated device wafer to form a protective layer, processing the baked device wafer, and dissolving the protective layer from the processed wafer with a solvent at a temperature not less than 65° C. The solvent includes water. The baking is at a temperature from 150° C. to 170° C. The protective layer remains on the baked device wafer during processing. The poly(vinyl alcohol) has a degree of hydrolysis greater than or equal to 93%.

19 Claims, 5 Drawing Sheets

(56) References Cited

U.S. PATENT DOCUMENTS

2014/0113435 A1    4/2014  Peddi et al.
2016/0172595 A1    6/2016  Malinowski et al.

* cited by examiner

REMOVABLE TEMPORARY PROTECTIVE LAYERS FOR USE IN SEMICONDUCTOR MANUFACTURING

CROSS REFERENCE TO RELATED APPLICATIONS

This application claims the benefit under Title 35, U.S.C. § 119(e) of U.S. Provisional Patent Application Ser. No. 62/448,177, entitled REMOVABLE TEMPORARY PROTECTIVE LAYERS FOR USE IN SEMICONDUCTOR MANUFACTURING, filed on Jan. 19, 2017, the entire disclosure of which is expressly incorporated by reference herein.

FIELD

The present invention relates to protective layers, and in particular, to temporary protective layers for use in semiconductor device manufacturing.

BACKGROUND

Advanced semiconductor devices may have increased sensitivity to particulate contamination in packaging the devices, resulting in yield losses. For example, after the devices are completed at a wafer level, the process of wafer singulation, or dicing, of the semiconductor device wafers into individual integrated circuits, or die, for packaging can expose the device surfaces to particulate contamination resulting in the loss of devices at packaging.

SUMMARY

A method for temporarily protecting a semiconductor device wafer during processing includes preparing a solution including a poly(vinyl alcohol) and water, coating the device wafer with the prepared solution, baking the coated device wafer at a temperature from 150° C. to 170° C. to form a protective layer, processing the baked device wafer while the protective layer remains on the baked device wafer, and dissolving the protective layer from the processed wafer with a solvent at a temperature not less than 65° C. The solvent includes water. The poly(vinyl alcohol) has a degree of hydrolysis greater than 93%.

Various embodiments concern a method for temporarily protecting a semiconductor device wafer during processing. The method includes preparing a solution including poly (vinyl alcohol) and water, coating the device wafer with the prepared solution, baking the coated device wafer at a temperature from 150° C. to 170° C. to form a protective layer; processing the baked device wafer, and dissolving the protective layer from the processed wafer with a solvent at a temperature not less than 65° C. The solvent includes water. The protective layer remains on the baked device wafer during processing. The poly(vinyl alcohol) has a degree of hydrolysis greater than or equal to 93%. In some embodiments, the processing includes dicing. In some embodiments, the poly(vinyl alcohol) has a degree of hydrolysis from 93% to 99.3%. In some embodiments, a concentration of the poly(vinyl alcohol) in the solution is from 5 wt. % to 30 wt. % of the solution, and the balance is water. In some embodiments, the coating of the device wafer includes spin coating the prepared solution onto a surface of the device wafer. In some embodiments, the baking of the coated device wafer is for a time from 1 minute to 12 minutes. In some embodiments, the dissolving the protective layer is for a time from 1 minute to 30 minutes. In some embodiments, the dissolving of the protective layer includes immersing the processed wafer in the solvent. In some embodiments, the dissolving of the protective layer includes spraying the solvent onto the processed wafer. In some embodiments, the solvent consists of water.

Various embodiments concern a method for temporarily protecting a semiconductor device wafer during wafer singulation. The method includes preparing a solution including poly(vinyl alcohol) and water, coating the device wafer with the prepared solution, baking the coated device wafer at a temperature from 135° C. to 170° C. to form a protective layer; dicing the baked device wafer, and dissolving the protective layer from the diced wafer with a solvent at a temperature not less than 65° C. The solvent includes water. The protective layer remains on the baked device wafer during dicing. The poly(vinyl alcohol) has a degree of hydrolysis greater than or equal to 98.4%. In some embodiments, the poly(vinyl alcohol) has a degree of hydrolysis from 98.4% to 99.3%. In some embodiments, preparing the solution includes heating the water to a temperature from 80° C. to 98° C., mixing the poly(vinyl alcohol) into the heated water, and stirring the mixture to form the solution. In some embodiments, a concentration of the poly(vinyl alcohol) in the solution is from 5 wt. % to 30 wt. % of the solution, and the balance is water. In some embodiments, the coating of the device wafer includes spin coating the prepared solution onto a surface of the device wafer. In some embodiments, the baking of the coated device wafer is for a time from 1 minute to 12 minutes. In some embodiments, the dissolving the protective layer is for a time from 1 minute to 30 minutes. In some embodiments, the dissolving of the protective layer includes immersing the diced wafer in the solvent. In some embodiments, the dissolving of the protective layer includes spraying the solvent onto the diced wafer. In some embodiments, the solvent consists of water.

The above mentioned and other features of the invention, and the manner of attaining them, will become more apparent and the invention itself will be better understood by reference to the following description of embodiments of the invention taken in conjunction with the accompanying drawings.

DETAILED DESCRIPTION

As noted above, the presence of particulate contamination associated with, for example, a dicing process can result in yield losses of advanced semiconductor devices. The particulate contamination can be, for example, airborne particulate contamination. Airborne particles can settle on the semiconductor devices while they wait in queue to be diced and/or while the individual die are waiting in queue to be picked off of dicing tape and placed into packages. Particulate contamination can be generated for example, during the dicing process. Once particulate contamination settles on the semiconductor devices, it may be difficult to remove.

Embodiments of the present disclosure provide a temporary poly(vinyl alcohol) layer on the semiconductor devices to prevent particulate contamination from settling on the device wafer while the wafer is waiting to be processed, while the wafer is being processed, and after the wafer is processed. Some embodiments of the disclosure provide a temporary poly(vinyl alcohol) layer on the semiconductor devices to prevent particulate contamination from settling on the device wafer while the wafer is waiting to be diced, while the wafer is being diced, and after the wafer is diced and until such time as the individual die are picked and placed into a package. It has been found that a poly(vinyl alcohol) layer formed according to the embodiments of this disclosure is able to withstand exposure to the room temperature water used during the dicing process without substantial loss of thickness or adhesion to the semiconductor device. After dicing and before individual die are picked and placed into packages, the poly(vinyl alcohol) layer can be readily removed with a heated solvent including water, according to embodiments of this disclosure, carrying away any particulate contamination that would otherwise have settled on the semiconductor devices.

Poly(vinyl alcohol) layers formed according to embodiments of this disclosure also have an optical transmission of at least 80% over the visible spectrum. This is important because the pattern of the semiconductor devices must be clearly visible for accurate alignment during wafer dicing. Poly(vinyl alcohol) layers formed according to embodiments of this disclosure are also non-corrosive to materials of the semiconductor devices with which they might be in contact, such as copper bonding pads.

Figure 1:
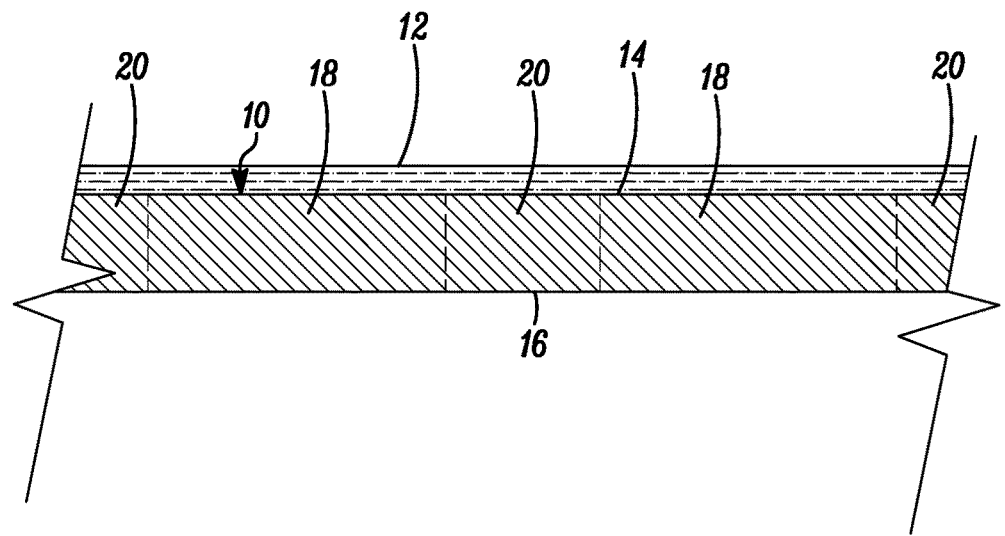
FIG. 1 is a schematic cross-section of a portion of a semiconductor device wafer to be diced into individual die and a temporary protective layer applied to the device wafer, according to embodiments of this disclosure.

FIG. 1 is a schematic cross-section of a portion of a semiconductor device wafer 10 to be diced into individual die and a temporary protective layer 12 applied to the device wafer 10, according to embodiments of this disclosure. As shown in FIG. 1, the device wafer 10 includes a top surface 14, a bottom surface 16, and a plurality of semiconductor devices 18 (two shown) separated by a plurality of dicing streets 20 (three shown). Prior to dicing, as shown in FIG. 1, the semiconductor devices 18 and the dicing streets 20, although separately defined, are all integral parts of the device wafer 10.

The protective layer 12 can be applied to the top surface 14 of the device wafer 10 by first preparing a solution including a poly(vinyl alcohol) and water. In some embodiments, the solution can be prepared by heating the water, mixing the poly(vinyl alcohol) into the water, and stirring the mixture for 2 to 3 hours to ensure that the poly(vinyl alcohol) is completely dissolved in the water. In other embodiments, the poly(vinyl alcohol) can be mixed into the water and then the mixture can be heated while stirring. In some embodiments, the water can be heated to a temperature as low as 80° C., 85° C., or 90° C., or as high as 93° C., 95° C., or 98° C., or to a temperature within any range defined between any two of the preceding temperatures. For example, in some embodiments, the water can be heated to a temperature ranging from 80° C. to 98° C., 80° C. to 95° C., 85° C. to 95° C., or 90° C. to 95° C. In some other embodiments, the poly(vinyl alcohol) may be added to the water before the water is heated, and the poly(vinyl alcohol) and the water heated together. In some embodiments, the resulting viscous solution can be filtered through one or more filters, such as a 0.1 micron, a 0.5 micron, and/or a 1 micron filter.

In some embodiments, a concentration of the poly(vinyl alcohol) in the prepared solution can be as low as 5 weight percent (wt. %), 10 wt. %, or 15 wt. % or as high as 20 wt. %, 25 wt %, or 30 wt. %, or may be within a range defined between any two of the preceding values. For example, in some embodiments, the concentration of the poly(vinyl alcohol) in the prepared solution can range from 5 wt. % to 30 wt. %, 5 wt. % to 20 wt. %, 5 wt. % to 15 wt. %, 10 wt. % to 25 wt. %, or 15 wt. % to 20 wt. %.

After the poly(vinyl alcohol) solution is prepared, the top surface 14 of the device wafer 10 can be coated with the prepared solution to form the protective layer 12. In some embodiments, the device wafer 10 can be coated by spin coating. In spin coating, a suitable amount of the solution is dispensed onto the top surface 14, and then the device wafer 10 is rapidly spun to evenly coat the top surface 14. In some embodiments, the device wafer 10 can be spun for a time as short as 10 seconds, 15 seconds, 20 seconds, or 25 seconds, or as long as 35 seconds, 40 seconds, 45 seconds, 50 seconds, 55 seconds or 60 seconds, or for any time between any two of the preceding times. In some embodiments, the device wafer 10 can be spun for a time ranging from 10 seconds to 60 seconds, 15 seconds to 55 seconds, 20 seconds to 50 seconds, or 25 seconds to 45 seconds. In some embodiments, the device wafer 10 may be spun at a speed as low as 800 revolutions per minute (RPM), 900 RPM, 1,000 RPM, or 1,100 RPM, or as high as 1,200 RPM, 1,300 RPM, 1,400 RPM, 1,500 RPM, or 1,600 RPM, or at any speed between any two of the preceding speeds. In some embodiments, the device wafer 10 may be spun at a speed ranging from 800 RPM to 1,600 RPM, 900 RPM to 1,500 RPM, 1,000 RPM to 1,400 RPM, or 1,100 RPM to 1,300 RPM. In addition to distributing the solution across the top surface 14, the rapid spinning serves to quickly evaporate much of the water from the protective layer 12. In other embodiments, the device wafer 10 can be coated by spray coating, roll coating, or other coating methods known in the art.

In some embodiments, a thickness of the protective layer 12 can be as low as 0.5 microns, 0.6 microns, 0.7 microns, 0.8 microns, or 0.9 microns, or as high as 1 micron, 2 microns, 3 microns, 4 microns, or 5 microns, or within any range defined between any two of the preceding values. For example, in some embodiments, the thickness of the protective layer 12 range from 0.5 microns to 5 microns, 0.6 microns, to 4 microns, 0.7 microns to 3 microns, 0.8 microns, to 2 microns, or 0.9 microns to 1 micron.

After the device wafer 10 is coated with the poly(vinyl alcohol) solution, the device wafer 10 can be baked to evaporate most of the water remaining in the protective layer 12. In some embodiments, the baking is done at a temperature as low as 135° C., 140° C., or 145° C. or as high as 150° C., 155° C., 160° C., 165° C., or 170° C., or within a temperature range defined between any two of the preceding temperatures. For example, in some embodiments, the baking is done at a temperature ranging from 135° C. to 170° C., 140° C. to 165° C., 145° C. to 160° C., 150° C. to 155° C. or 150° C. to 170° C. It has been found that at bake temperatures greater than 200° C., the average optical transmission averaged across the visible spectrum can drop below 80%. It has also been found that at a bake temperature of 200° C., the protective layer 12 may not be readily removed by dissolving the protective layer 12 with a solvent including water, even if the water is heated to a temperature of 80° C.

In some embodiments, the baking can include a hot plate bake in which the bottom side 16 of the device wafer 10 is in physical contact with a heated surface, or hot plate (not shown). In such embodiments, the device wafer 10 can be baked for a time as short as 1 minute, 2 minutes, or 3 minutes, or as long as 4 minutes, 5 minutes, or 6 minutes, or for any time between any two preceding times. For example in some embodiments, the device wafer can be baked on a hot plate for a time ranging from 1 minute to 6 minutes, 2 minutes to 5 minutes, or 3 minutes to 4 minutes. In some embodiments, the baking can include a convection oven bake in which a flow of heated air passes across the protective layer 12 on the top surface 14. In such embodiments, the device wafer 10 can be baked for a time as short as 4 minutes, 5 minutes, or 6 minutes, or as long as 8 minutes, 10 minutes, or 15 minutes, or for any time between any two preceding times. For example, in some embodiments, the device wafer can be convection baked for a time ranging from 4 minutes to 15 minutes, 5 minutes to 10 minutes, or 6 minutes to 8 minutes. In some embodiments, baking can include both a hot plate bake and a convection oven bake. In such embodiments, a total bake time can be as short as 5 minutes, 6 minutes, or 7 minutes, or as long as 8 minutes, 9 minutes, or 10 minutes, or for a time between any two preceding times. For example, in embodiments including both a hot plate bake and a convection oven bake, the total bake time can range from 5 minutes to 10 minutes, 6 minutes to 9 minutes, or 7 minutes to 8 minutes. It has been found that at higher bake temperatures, such as 150° C., total bake times longer than 10 minutes can decrease the optical transmission of the protective layer 12 to close to 80% across some of the visible spectrum.

After the device wafer 10 is baked, the protective layer 12 is substantially insoluble in water at room temperature. For the purposes of this disclosure, room temperature ranges from 20° C. to 30° C. The protective layer 12 protects the top surface 14 of the device wafer 10 from particulate contamination.

Figure 2:
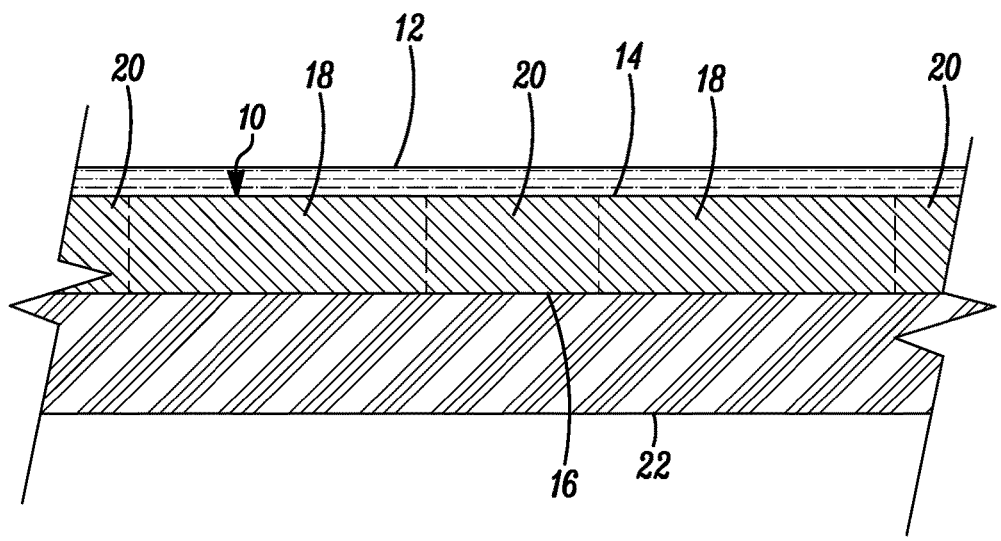
FIG. 2 is a schematic cross-section of the portion of the semiconductor device wafer of FIG. 1 mounted on dicing tape.

FIG. 2 is a schematic cross-section of the portion of the semiconductor device wafer 10 of FIG. 1 mounted on a dicing tape 22. As shown in FIG. 2, the dicing tape 22 is adhered to the bottom side 16 of the device wafer 10. The dicing tape 22 can be any dicing tape known in the art. The dicing tape 22 is typically also adhered to a dicing frame (not shown) to suspend the device wafer 10 within the dicing frame. The dicing frame provides a mechanical interface for processing the device wafer 10 on a dicing saw (not shown), as is known in the art. Once the device wafer 10 is mounted on the dicing tape 22, the device wafer 10 is ready to be diced. While the device wafer 10 is waiting in queue to be diced, any airborne particulate contamination will fall onto the protective layer 12, and not the top surface 14 of the device wafer 10.

Figure 3:
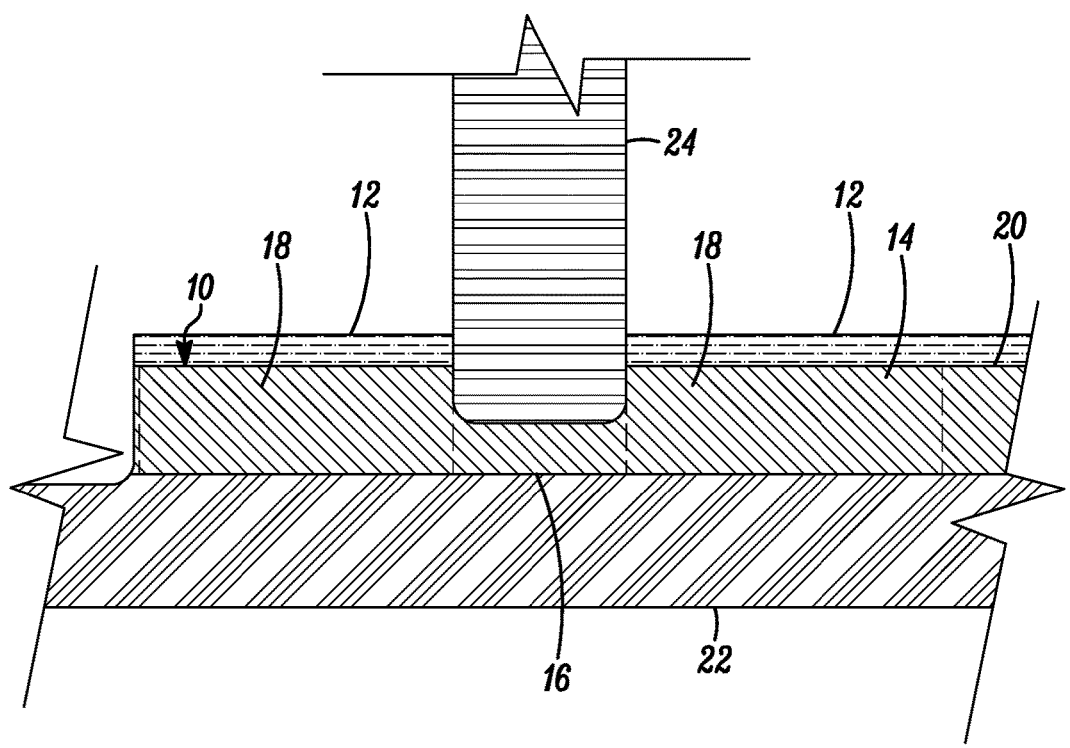
FIG. 3 is a schematic cross-section of the portion of the semiconductor device wafer of FIG. 2 showing the temporary protective layer on the device wafer and the individual die during the dicing process.

FIG. 3 is a schematic cross-section of the portion of the semiconductor device wafer 10 of FIG. 2 showing the temporary protective layer 12 on the device wafer 10 during the dicing process. As shown in FIG. 3, a dicing blade 24 can be employed to cut through the device wafer 10 and slightly into the dicing tape 22, to remove the dicing streets 20 and separate the semiconductor devices 18 into individual die. The dicing blade 24 can be any type of dicing blade known in the art, for example, a diamond impregnated resin blade. The dicing blade 24 shown in FIG. 3 rotates in a direction either into or out of the page of the drawing. As shown in FIG. 3, the dicing street 20 on the left side of the figure is completely diced through, the dicing street 20 in the middle of the figure between the two semiconductor devices 18 shown, is partially diced through, and the dicing street 20 on the right side of the figure has not yet been diced. Throughout the process, the area being diced by the dicing blade 24 is being sprayed by water (not shown) to cool the blade and flush away particles (not shown) removed from the dicing street 20 by dicing blade 24. The protective layer 12 remains intact on the top surface 14 because it is not soluble in the room temperature water used to cool the dicing blade 24. On large wafers, with many semiconductor devices 18, the top surface 14 of the device wafer 10 may be exposed to the cooling water spray for an extended period of time. The protective layer 12 in accordance with embodiments of the invention, is able to remain substantially insoluble an intact for such an extended period of time. In some embodiments, the protective layer 12 remains substantially insoluble an intact for a time as long as 2.5 hours, 3 hours, 5 hours, 8 hours, or 20 hours, or for as long as any time between any two of the preceding values. In addition to protecting the top surface 14 of the device wafer 10 from airborne particulates, the protective layer 12 also protects the top surface 14 from particles removed from the dicing street 20 which may not be completely flushed away by the cooling water spray.

Figure 4:
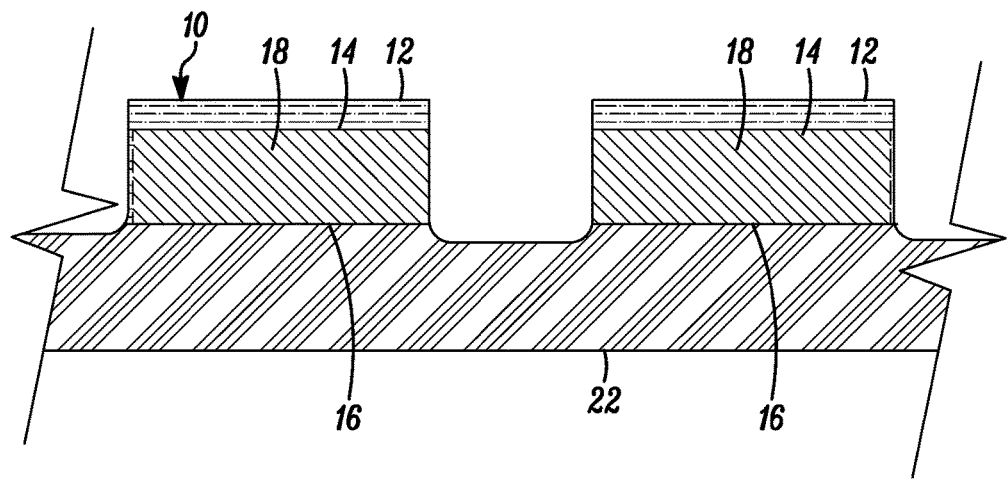
FIG. 4 is a schematic cross-section of the portion of the semiconductor device wafer of FIG. 3 after being diced showing the temporary protective layer on the individual die.

FIG. 4 is a schematic cross-section of the portion of the semiconductor device wafer 10 of FIG. 3 after being diced showing the temporary protective layer 12 on the individual semiconductor device 18 die. As noted above in reference to FIG. 4, the protective layer 12 remains intact on the top surface 14 of each of the semiconductor devices 18, continuing to protect the top surface 14 from airborne particulate contamination.

Figure 5:
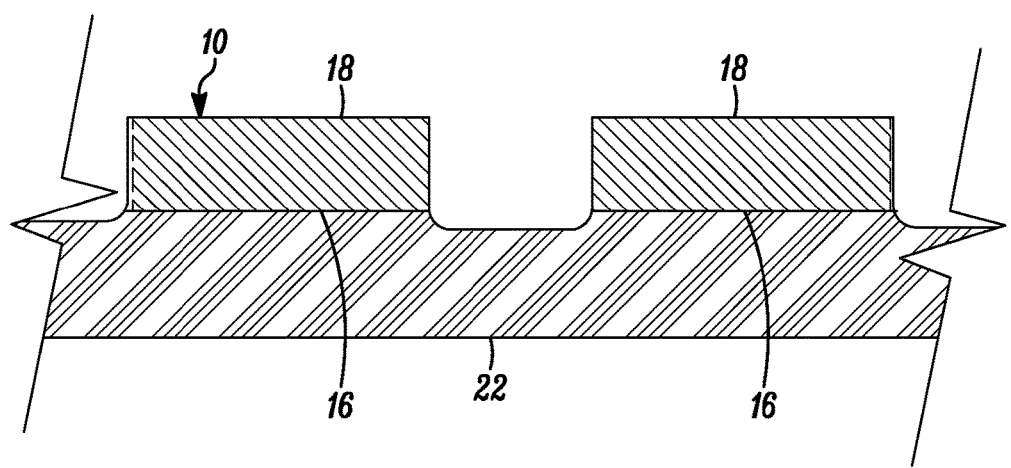
FIG. 5 is a schematic cross-section of the portion of the semiconductor device wafer of FIG. 4 after removal of the temporary protective layer, according to embodiments of this disclosure.

FIG. 5 is a schematic cross-section of the portion of the diced semiconductor device wafer 10 of FIG. 4 after removal of the temporary protective layer 12, according to embodiments of this disclosure. In some embodiments, the protective layer 12 can be removed by dissolving the protective layer 12 with a solvent including water, the solvent having a temperature not less than 65° C. In some embodiments, the protective layer 12 can be dissolved by the solvent having a temperature as low as 65° C., 70° C., 75° C., 80° C., or as high as 85° C., 90° C., 95° C., 99° C., or within a temperature range defined between any two of the preceding temperatures. For example, in some embodiments, the protective layer 12 can be dissolved by the solvent having a temperature ranging from 65° C. to 99° C., 70° C. to 95° C., 75° C. to 90° C., 80° C. to 85° C., or 80° C. to 95° C. In some embodiments, the solvent consists of water. In some other embodiments, the solvent includes water and a surfactant.

In some embodiments, the protective layer 12 can be dissolved by immersing the diced device wafer 10 into the solvent. In other embodiments, the protective layer 12 can be dissolved by spraying the solvent onto the diced device wafer 10. The solvent can be sprayed at a relatively low pressure so as to not dislodge the diced semiconductor devices from the dicing tape 22. In some embodiments, the diced device wafer 10 can be immersed in the solvent, or sprayed by the solvent, for a time as short as 1 minute, 2 minutes, 4 minutes, 6 minutes, or 8 minutes, or as long as 10 minutes, 15 minutes, 20 minutes, 25 minutes, or 30 minutes, or for a time between any two of the preceding times. For example, in some embodiments, the diced device wafer 10 can be immersed in the solvent, or sprayed by the solvent, for a time ranging from 1 minute to 30 minutes, 2 minutes to 25 minutes, 4 minutes to 20 minutes, 6 minutes to 15 minutes, or 8 minutes to 10 minutes.

It has been found that a poly(vinyl alcohol) having a degree of hydrolysis greater than 93%, greater than 95%, greater than 97%, or greater than 99%, for example, is able to form a layer that is largely insoluble in water at room temperature, but readily dissolved in a heated solvent including water, as described above. It was found that a poly(vinyl alcohols) having a lesser degree of hydrolysis, such as 87% to 89%, remain largely soluble in room temperature water even when baked at temperatures as high as 150° C.

In some embodiments, in which the degree of hydrolysis of the poly(vinyl alcohol) is greater than 93%, the device wafer 10 can be baked at a temperature from 150° C. to 170° C. for a time from 2 minutes to 10 minutes. It has been found that for poly(vinyl alcohol) with a degree of hydrolysis from 93% to 96%, the bake temperature must be at least 150° C. for the protective layer 12 to be substantially insoluble in room temperature water for a period of at least two and a half hours. In some embodiments, in which the degree of hydrolysis of the poly(vinyl alcohol) is greater than 98.4%, the device wafer 10 can be baked at a temperature from 135° C. to 170° C. for a time from 2 minutes to 10 minutes. It has been found that for poly(vinyl alcohol) with a degree of hydrolysis from 98.4% to 99.3%, the bake temperature must be at least 135° C. for the protective layer 12 to be substantially insoluble in room temperature water for a period of at least two and a half hours.

While this invention has been described as relative to exemplary designs, the present invention may be further modified within the spirit and scope of this disclosure. Further, this application is intended to cover such departures from the present disclosure as come within known or customary practice in the art to which this invention pertains.

EXAMPLES

Example 1

Room Temperature Water Resistance as a Function of Bake Temperature and Degree of Hydrolysis Two poly(vinyl alcohol) solutions were prepared, one containing poly(vinyl alcohol) having a degree of hydrolysis from 98% to 99%, and another containing poly(vinyl alcohol) having a degree of hydrolysis greater than 99%. The degree of hydrolysis was provided by the manufacturer. Each of the solutions was prepared by heating 1,170 grams of water in a 3-necked, 2 liter glass flask to a temperature between 90° C. and 95° C. using a mantle heater. Poly(vinyl alcohol) in the amount of 130 grams was added in small increments while vigorously stirring the mixture. After all of the poly(vinyl alcohol) was added, the mixture was stirred for another 3 hours to ensure the poly(vinyl alcohol) was completely dissolved. The resulting solutions were each filtered through a 1 micron filter and then through a 0.1 micron filter.

The two prepared solutions were each spin coated onto six, 300 mm silicon wafers, three wafers for each of the two solutions. For each wafer, 10 ml of solution was dispensed onto the wafer, and the wafer spun at 900 RPM for 30 seconds. Each of the wafers was baked on a hot plate for 2 minutes at 120° C., 135° C. or 150° C. A cross-hatch pattern was made on each of the wafers for a tape adhesion test. The thickness of the poly(vinyl alcohol) protective layer on each of the wafers was measured.

The six wafers were immersed in water at a temperature of 30° C. for two and a half hours. After the immersion, the wafers were dried by flowing nitrogen gas and the thickness of the poly(vinyl alcohol) protective layer on each of the wafers was measured again. The results are shown in Table 1 below. Adhesion of the protective layer on each of the wafers was determined by an adhesion tape test per ASTM D3359 cross grid test procedure. All wafers passed the adhesion tape test as viewed under an optical microscope.

TABLE 1

| Protective layer | Hydrolysis: 98% to 99% | | | Hydrolysis: >99% | | |
|---|---|---|---|---|---|---|
| Thickness (Å) | 120° C. | 135° C. | 150° C. | 120° C. | 135° C. | 150° C. |
| Initial | 7,514 | 7,344 | 7,550 | 8,910 | 9,164 | 9,185 |
| Final | 1,595 | 6,121 | 7,589 | 7,104 | 9,212 | 9,389 |

As shown in Table 1, the poly(vinyl alcohol) protective layer having a degree of hydrolysis from 98% to 99% was insoluble in the 30° C. water when baked at a temperature of 150° C. (in bold), but was not insoluble when baked at a temperature of 135° C. In contrast, the poly(vinyl alcohol) protective layer having a degree of hydrolysis greater than 99% was insoluble in the 30° C. water when baked at a temperature of either 135° C. or 150° C. (in bold). Neither poly(vinyl alcohol) protective layer was insoluble in the 30° C. water when baked at a temperature of 120° C. Thus, resistance of the poly(vinyl alcohol) protective layers to 30° C. water is a function of both the bake temperature and the degree of hydrolysis.

The six wafers were immersed in 85° C. water for 5 minutes. The poly(vinyl alcohol) protective layers were successfully removed from all six wafers.

Example 2

Room Temperature Water Resistance as a Function of Bake Temperature and Degree of Hydrolysis Five poly(vinyl alcohol) solutions were prepared, each having a degree of hydrolysis ranging from 88% to 99.3%, as indicated in Table 2 below. The degree of hydrolysis was provided by the manufacturer. Each of the solutions was prepared by heating 1,170 grams of water in a 3-necked, 2 liter glass flask to a temperature between 90° C. and 95° C. using a mantle heater. Poly(vinyl alcohol) in the amount of 130 grams was added in small increments while vigorously stirring the mixture. After all of the poly(vinyl alcohol) was added, the mixture was stirred for another 3 hours to ensure the poly(vinyl alcohol) was completely dissolved. The resulting solutions were each filtered through a 1 micron filter and then through a 0.1 micron filter.

The five prepared solutions were each spin coated onto fifteen, 300 mm silicon wafers, three wafers for each of the five solutions. For each wafer, 10 ml of solution was dispensed onto the wafer, and the wafer spun at 900 RPM for 30 seconds. Each of the wafers was baked on a hot plate for 2 minutes at 120° C., 135° C. or 150° C. The thickness of the poly(vinyl alcohol) protective layer on each of the wafers was measured.

The fifteen wafers were immersed in water at a temperature of 30° C. for two and a half hours. After the immersion, the wafers were dried by flowing nitrogen gas and the thickness of the poly(vinyl alcohol) protective layer on each of the wafers was measured again. The results are shown in Table 2 below.

TABLE 2

| Degree of Hydrolysis | Bake Temp | Initial Thickness (Å) | Final Thickness (Å) | Thickness Change |
|---|---|---|---|---|
| 88% | 80° C. | 79404 | 15 | 0.00% |
| | 135° C. | 53074 | 41 | 0.10% |
| | 150° C. | 78748 | 143 | 0.20% |
| 93% | 80° C. | 5955 | 48 | 0.80% |
| | 135° C. | 5609 | 1324 | 23.60% |
| | 150° C. | 5503 | 5848 | 106.30% |
| 96% | 80° C. | 4506 | 34 | 0.80% |
| | 135° C. | 4200 | 3630 | 86.40% |
| | 150° C. | 4031 | 4591 | 113.90% |
| 98.40% | 80° C. | 22710 | 33 | 0.10% |
| | 135° C. | 18828 | 19993 | 106.20% |
| | 150° C. | 22801 | 24424 | 107.10% |
| 99.30% | 80° C. | 16058 | 42 | 0.30% |
| | 135° C. | 13497 | 14309 | 106.00% |
| | 150° C. | 16005 | 16963 | 106.00% |

As shown in Table 2, the poly(vinyl alcohol) protective layer having a degree of hydrolysis of 88% was easily dissolved even when baked at 150° C. In contrast, the poly(vinyl alcohol) protective layers having a degree of hydrolysis of 93% or 96% were insoluble in the 30° C. water when baked at a temperature of 150° C. (in bold), but were not insoluble when baked at a temperature of 135° C. The poly(vinyl alcohol) protective layers having a degree of hydrolysis of 98.4% or 99.3% were insoluble in the 30° C. water when baked at a temperature of either 135° C. or 150° C. (in bold). Thus, resistance of the poly(vinyl alcohol) protective layers to 30° C. water is a function of both the bake temperature and the degree of hydrolysis.

Example 3

Room Temperature Water Resistance as a Function of Bake Time

A poly(vinyl alcohol) solution containing poly(vinyl alcohol) having a degree of hydrolysis greater than 99% was prepared and dispensed onto seven, 300 mm silicon wafers, as described above in Example 1. The coated wafers were baked in proximity to a hot plate at a temperature of 150° C. for 5 minutes, and then baked in contact with a hot plate at a temperature of 150° C. for 5 minutes. The thickness of the poly(vinyl alcohol) protective layer on each of the wafers was measured.

The seven wafers were immersed in water at a temperature of 30° C., each for a different time ranging from 5 hours to 117 hours. After the immersion, the wafers were dried by flowing nitrogen gas and the thickness of the poly(vinyl alcohol) protective layer on each of the wafers was measured again. The results are shown in Table 3 below.

TABLE 3

| Protective layer Thickness (Å) | 5 hours | 8 hours | 20 hours | 29 hours | 40 hours | 93 hours | 117 hours |
|---|---|---|---|---|---|---|---|
| Initial | 7643 | 7385 | 7583 | 6920 | 7260 | 7406 | 7087 |
| Post-Soak | 7604 | 7413 | 7516 | 6941 | 7121 | 7435 | 6864 |
| Change | 0.52% | −0.38% | 0.89% | −0.30% | 1.91% | −0.39% | 3.15% |

As shown in Table 3, the poly(vinyl alcohol) protective layer having a degree of hydrolysis greater than 99% and baked at 150° C. for 10 minutes was insoluble in the 30° C. water for up to 93 hours. Only at 117 hours did the protective layer show evidence of dissolution.

Example 4

Dissolution as a Function of Water Temperature

A poly(vinyl alcohol) solution containing poly(vinyl alcohol) having a degree of hydrolysis greater than 99% was prepared and dispensed onto five, 300 mm silicon wafers, as described above in Example 1. The coated wafers were baked at a temperature of 150° C. for 2 minutes. A 2 mm×2 mm cross-hatch pattern was made on each of the wafers for a tape adhesion test per ASTM D3359 cross grid test procedure. The thickness of the poly(vinyl alcohol) protective layer on each of the wafers was measured.

Figure 6:
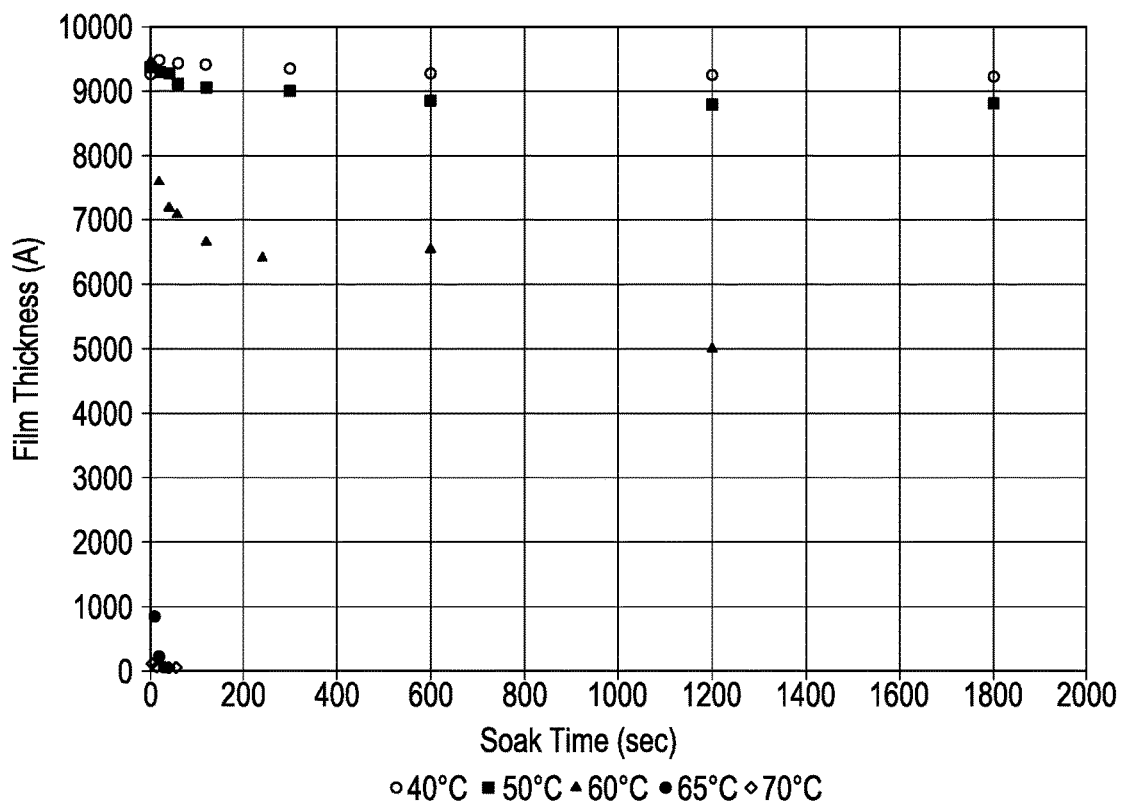
FIG. 6 is a graph of film thickness as a function of soak time in water at various temperatures for a temporary protective layer, according to embodiments of this disclosure.

Each of the five wafers was immersed in water for a series of times at one of five different temperatures ranging from 40° C. to 70° C. The immersion times increased from 5 seconds to 1,800 seconds. After each immersion, the wafers were dried by flowing nitrogen gas and the thickness of the poly(vinyl alcohol) protective layer on each of the wafers was measured again. The results are shown in FIG. 6. Adhesion of the protective layer on each of the wafers was determined by an adhesion tape test per ASTM D3359 cross grid test procedure. All wafers passed the adhesion tape test as viewed under an optical microscope. As shown in FIG. 6, the poly(vinyl alcohol) protective layer was readily dissolved at temperatures as low as 65° C.

Example 5

Figure 7:
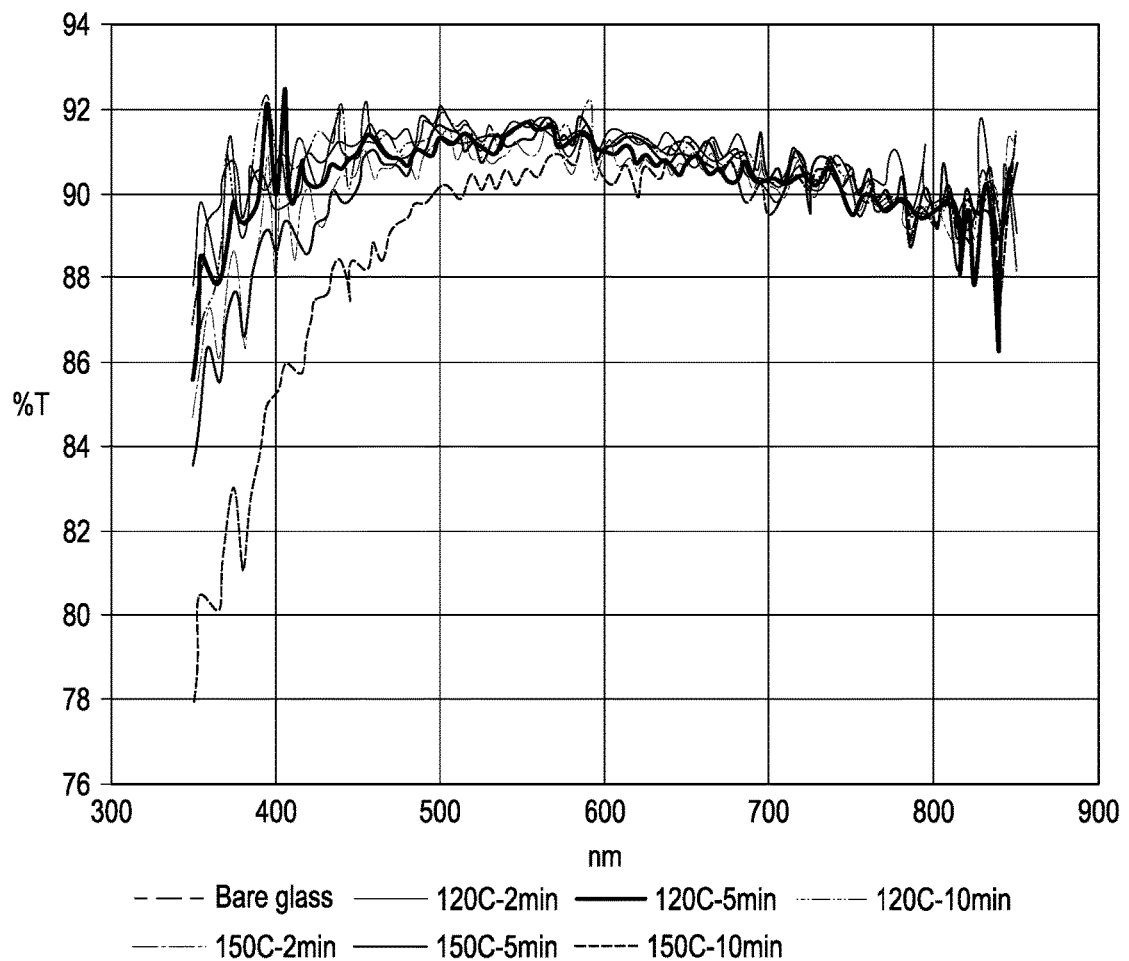
FIG. 7 is a graph of optical transmission as a function of wavelength for various bake times and temperatures for a temporary protective layer, according to embodiments of this disclosure.

Optical Transmission as a Function of Wavelength for Various Bake Times and Temperatures A poly(vinyl alcohol) solution containing poly(vinyl alcohol) having a degree of hydrolysis greater than 99% was prepared and dispensed onto six, 4-inch glass wafers, as described above in Example 1. Each of the coated wafers was baked on a hot plate at a temperature of 120° C. or 150° C., and for a time of 2 minutes, 5 minutes, or 10 minutes. After baking, optical transmission percent was measured at wavelengths of 350 nm to 850 nm for each of the coated wafers and compared against a seventh, uncoated glass wafer. The results are shown in FIG. 7. As shown in FIG. 7, the optical transmission is maintained above 80% for all but the shortest wavelengths of the wafer baked for 10 minutes at 150° C.

Example 6

Optical Transmission as a Function of Degree of Hydrolysis and Bake Temperature Four poly(vinyl alcohol) solutions were prepared, each having a degree of hydrolysis ranging from 88% to 99.3%, as indicated in Table 4 below. The degree of hydrolysis was provided by the manufacturer. Each of the solutions was prepared by heating 1,170 grams of water in a 3-necked, 2 liter glass flask to a temperature between 90° C. and 95° C. using a mantle heater. Poly(vinyl alcohol) in the amount of 130 grams was added in small increments while vigorously stirring the mixture. After all of the poly(vinyl alcohol) was added, the mixture was stirred for another 3 hours to ensure the poly(vinyl alcohol) was completely dissolved. The resulting solutions were each filtered through a 1 micron filter and then through a 0.1 micron filter.

The four prepared solutions were each spin coated onto twelve, 300 mm silicon wafers, three wafers for each of the five solutions. For each wafer, 10 ml of solution was dispensed onto the wafer, and the wafer spun at 900 RPM for 30 seconds. Each of the wafers was baked on a hot plate for 5 minutes at 150° C., 200° C. or 250° C. After baking, optical transmission percent was measured at wavelengths of 380 nm to 780 nm and an average percentage transmission determined for each of the coated wafers. The results are shown in Table 4. As shown in Table 4, the average optical transmission percentage is maintained above 90% for wafers baked at 150° C. and above 80% for wafers baked at 200° C., but falls below 80% for wafers baked at 250° C. (bold). This suggests that to meet an optical transmission of at least 80%, for a 5 minute bake, the temperature should be no greater than 200° C.

TABLE 4

| Degree of Hydrolysis | Bake Temp | Average Percentage Transmission |
|---|---|---|
| 88% | 150° C. | 90.60% |
|  | 200° C. | 86.45% |
|  | 250° C. | 78.23% |
| 93% | 150° C. | 90.03% |
|  | 200° C. | 80.97% |
|  | 250° C. | 76.96% |
| 98.40% | 150° C. | 90.58% |
|  | 200° C. | 81.70% |
|  | 250° C. | 67.85% |
| 99.30% | 150° C. | 90.20% |
|  | 200° C. | 87.11% |
|  | 250° C. | 60.74% |

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above described features.

The invention claimed is:

1. A method for temporarily protecting a semiconductor device wafer during processing, the method including:
preparing a solution including a poly(vinyl alcohol) and water, the poly(vinyl alcohol) having a degree of hydrolysis greater than or equal to 93%;
coating the device wafer with the prepared solution;
baking the coated device wafer at a temperature from 150° C. to 170° C. to form a protective layer;
dicing the baked device wafer with a dicing blade while spraying the device wafer and dicing blade with water, the protective layer remaining on the baked device wafer during dicing; and
dissolving the protective layer from the processed wafer with a solvent at a temperature not less than 65° C., the solvent including water.

2. The method of claim 1, wherein the poly(vinyl alcohol) has a degree of hydrolysis from 93% to 99.3%.

3. The method of claim 1, wherein a concentration of the poly(vinyl alcohol) in the solution is from 5 wt. % to 30 wt. % of the solution, and the balance is water.

4. The method of claim 1, wherein the coating of the device wafer includes spin coating the prepared solution onto a surface of the device wafer.

5. The method of claim 1, wherein the baking of the coated device wafer is for a time from 1 minute to 12 minutes.

6. The method of claim 1, wherein the dissolving the protective layer is for a time from 1 minute to 30 minutes.

7. The method of claim 1, wherein the dissolving of the protective layer includes immersing the processed wafer in the solvent.

8. The method of claim 1, wherein the dissolving of the protective layer includes spraying the solvent onto the processed wafer.

9. The method of claim 1, wherein the solvent consists of water.

10. A method for temporarily protecting a semiconductor device wafer during wafer singulation, the method including:
preparing a solution including a poly(vinyl alcohol) and water, the poly(vinyl alcohol) having a degree of hydrolysis greater than or equal to 98.4%;
coating the device wafer with the prepared solution;
baking the coated device wafer at a temperature from 135° C. to 170° C. to form a protective layer;
dicing the baked device wafer with a dicing blade while spraying the device wafer and dicing blade with water, the protective layer remaining on the baked device wafer during dicing; and
dissolving the protective layer from the diced wafer with a solvent at a temperature not less than 65° C. to dissolve the protective layer, the solvent including water.

11. The method of claim 10, wherein the poly(vinyl alcohol) has a degree of hydrolysis from 98.4% to 99.3%.

12. The method of claim 10, wherein preparing the solution includes:
heating the water to a temperature from 80° C. to 98° C.;
mixing the poly(vinyl alcohol) into the heated water; and
stirring the mixture to form the solution.

13. The method of claim 10, wherein a concentration of the poly(vinyl alcohol) in the solution is from 5 wt. % to 30 wt. % of the solution, and the balance is water.

14. The method of claim 10, wherein the coating of the device wafer includes spin coating the prepared solution onto a surface of the device wafer.

15. The method of claim 10, wherein the baking of the coated device wafer is for a time from 1 minute to 12 minutes.

16. The method of claim 10, wherein the dissolving of the protective layer is for a time from 1 minute to 30 minutes.

17. The method of claim 10, wherein the dissolving of the protective layer includes immersing the diced wafer in the solvent.

18. The method of claim 10, wherein the dissolving of the protective layer includes spraying the solvent onto the diced wafer.

19. The method of claim 10, wherein the solvent consists of water.

* * * * *